(12) United States Patent
Fechalos et al.

(10) Patent No.: US 12,313,690 B2
(45) Date of Patent: May 27, 2025

(54) BATTERY-STRING MIDPOINT VOLTAGE MEASUREMENT APPARATUS AND METHOD

(71) Applicant: C&C Power, Inc., Carol Stream, IL (US)

(72) Inventors: William Fechalos, Carol Stream, IL (US); Charles McPherson, Carol Stream, IL (US)

(73) Assignee: C&C Power, Inc., Carol Stream, IL (US)

( * ) Notice: Subject to any disclaimer, the term of this patent is extended or adjusted under 35 U.S.C. 154(b) by 0 days.

(21) Appl. No.: 18/514,012

(22) Filed: Nov. 20, 2023

(65) Prior Publication Data

US 2024/0175932 A1    May 30, 2024

Related U.S. Application Data

(60) Provisional application No. 63/428,979, filed on Nov. 30, 2022.

(51) Int. Cl.
*G01R 31/389*    (2019.01)
*G01R 31/396*    (2019.01)
*H02J 7/00*    (2006.01)

(52) U.S. Cl.
CPC ......... *G01R 31/389* (2019.01); *G01R 31/396* (2019.01); *H02J 7/0014* (2013.01); *H02J 7/005* (2020.01)

(58) Field of Classification Search
CPC ..... G01R 31/389; G01R 31/396; H02J 7/005; H02J 7/0014
See application file for complete search history.

(56) References Cited

U.S. PATENT DOCUMENTS

| | | | |
|---|---|---|---|
| 8,558,508 B2 | 10/2013 | Fechalos et al. | |
| 2006/0194102 A1* | 8/2006 | Keshishian | H02J 7/0016 429/7 |
| 2008/0136627 A1* | 6/2008 | Hayakawa | G01P 15/08 340/540 |
| 2015/0229154 A1* | 8/2015 | Kaita | H02J 7/0031 320/118 |
| 2016/0100251 A1* | 4/2016 | Bracco | B06B 1/0207 381/59 |
| 2017/0168120 A1* | 6/2017 | Gach | G01R 31/367 |
| 2022/0255335 A1* | 8/2022 | Khozikov | H02J 7/0013 |

\* cited by examiner

*Primary Examiner* — Drew A Dunn
*Assistant Examiner* — Pamela J Jeppson
(74) *Attorney, Agent, or Firm* — Crowell & Moring LLP

(57) ABSTRACT

A mid-string voltage sensor is disposed in proximity to a storage-battery string and determines an error signal between the expected mid-string voltage and the actual mid-string voltage to aid in detecting faults in one or more of the batteries of the string. Each sensor is connected to or close to the battery string terminals and to a terminal at the midpoint of the group of batteries connected in series. The arrangement suppresses errors due to common-impedance coupling, and the measured voltages are decoupled from the battery system, prior to determining the error. A fractional error voltage is derived using a logarithmic ratio amplifier so that the error signal determination is performed at the sensor, with the resultant error signal suitable for coupling to a battery health monitor.

16 Claims, 4 Drawing Sheets

BATTERY-STRING MIDPOINT VOLTAGE MEASUREMENT APPARATUS AND METHOD

This application claims the benefit of priority to US application Ser. No. 63/428,979, filed on Nov. 30, 2022, which is incorporated herein in its entirety by reference.

TECHNICAL FIELD

This application may have relevance to the monitoring of the status of rechargeable batteries as used in power supply systems.

BACKGROUND

Direct current (DC) power is needed for many types of telephone communication equipment, for control equipment used at electric utility substations, computer data centers, and power plants, and other similar uses. The DC power may be supplied by a DC power source which may be supplied with AC power from an AC power source, such as the local power grid, a generator or prime mover, solar, wind turbines and other renewable energy sources. Standby batteries are utilized as a backup DC power source when the DC power source either cannot supply all the power required by the components or when the AC power supply or other external power source is not available, as during a power failure at the local electric utility, or in the power distribution system. The period of time where such battery backup is required may be reduced, for example, by providing local diesel-electric or turbine-powered electric generators or extended, for example, by judicious load shedding.

There are a variety of battery monitoring systems available. These battery monitoring systems may be configured to monitor each of the individual storage batteries in a battery string. Other monitors are configured to monitor individual storage battery terminal voltages as a means of identifying defective batteries. Such monitoring systems require a direct connection to each of the batteries in the string for proper functioning. Other battery string monitoring systems may use the time-rate-of-change of current from a battery string during a charging or discharging or operation or compare current values of a plurality of battery strings to determine the assess the condition of a battery string, such as in U.S. Pat. No. 8,558,508, issued on Oct. 15, 2013, which is incorporated herein by reference. Measurement of the battery characteristics under float charging conditions may be used to detect incipient failure of a battery in a string.

As batteries age, individual batteries may degrade such that the internal resistance increases. Over the life of the battery the internal resistance will increase at a rate determined by such factors as how many times the battery undergoes cycles of discharging and recharging, and other factors. The internal resistance of any cell will eventually increase to a value where the voltage drop across the effective internal resistance during discharge is so great that the battery can no longer deliver power at its rated capacity, overheats or otherwise fails. Other defects in the battery, or aging of the battery, may also result in degradation of the capacity of a battery to perform its function. Failures may occur in during the aging process and a short, for example, in a cell of a battery may result in overheating of the battery with consequent thermal overload, leading to significant damage to the equipment and facilities. Other failure modes exist.

In telecommunications applications, storage batteries may be typically be configured to supply 24 VDC or 48 VDC by disposing a plurality of 12 VDC lead-acid, Lithium-Ion-Phosphate storage batteries, or the like in a series string, A plurality of such strings may be connected in parallel to increase the current capacity of the backup system. When strings of batteries are used to increase the voltage being supplied or, in general, when batteries are connected in either series or parallel, the impedance of the overall string has an influence on the amount of energy that can be supplied. Other components of the physical assembly, including connecting links, terminal connections and the like which can exhibit resistance, and whose characteristics may vary with time, due to such factors as corrosion and changes in contact pressure also contribute to the resultant battery system status.

The batteries may be connected to the electrical loads and the battery charging equipment by conductive cables that are sized to withstand the heat generated by the passage of the high currents required by the connected loads, and to keep the voltage drop between the batteries and the load within design limits. Both of these effects arise from the resistance of the cables.

Measuring the midpoint voltage of a storage battery string is one technique of monitoring the condition of the string and there are several commercial products that address the need. For example, the GE Pulsar Edge and the Vicron Energy Monitor.

In a battery string, the midpoint voltage is expected to be one half of the voltage measured between the positive terminal and the negative terminal of the battery string. Since unbalances of 2 percent or more are indicative of a battery problem, the accuracy and precision of the midpoint voltage (also known as mid-string) measurement is an important design consideration. In some existing products, the midpoint voltage measurement must be designed into the storage battery system product or a complex battery health monitoring system and is difficult to retrofit, both from the viewpoint of data connection and communications protocol.

SUMMARY

A battery system and system for monitoring the performance of a battery system is described including a battery string midpoint voltage sensor communicating with a controller, and a status display. The midpoint voltage sensor is disposed to measure the battery voltage at a terminal having the same number of batteries disposed between a connection to a first system cable (which may be a system bus) at one end of the string and a second system cable (which may be another bus) disposed at the other end of the string. Herein we designate one bus as a positive bus and the other as a negative bus. For convenience we will term the negative bus the ground bus, however a person of skill in the art will recognize that other configurations are equally possible, including an arrangement wherein one bus is a negative bus and the other bus is the ground bus, which is often used.

The accuracy of the measurement of mid-string voltage depends on the quality and stability of the voltages that are used to represent the voltage across the terminals of the battery string as well as that measured at a midpoint of the string. Normally the length of the cable connecting to adjacent terminals of batteries of the of the battery group at the mid-point is short and robust, with little voltage drop, so that measuring the midpoint voltage at either the negative terminal of the upper group or the positive terminal of the lower group makes little practical difference, but it would be good practice to choose the same configuration for all strings of a particular installation.

Some previous techniques use the system bus voltage at a convenient point near the battery charger, or wherever the measuring system is located. This introduces an error with respect to the voltage that would be measured directly across each of the string ends. Such an error might be compensated if it were constant, but when in differing operating modes (standby, discharging, charging) the current flowing in the system bus changes dramatically in sense and magnitude depending on the demands of the load and the state-of-charge of the batteries in the battery string. This situation is more complex where more than one battery string is employed and where the cable lengths between the battery strings and the load or battery charger are different or are shared with each other.

Where the electrical path from the back-up battery string to the served load is shared with other batteries or loads, in whole or in part, the current in the portions of the circuit lying between a particular battery string and the point or points where the battery string voltage is measured will be affected by the actual current flowing in the conductors between the battery string the point where a voltage is sensed, as well as other such circuits. This current depends on the specific configuration of the conductors in the system and of the instantaneous magnitude and sense of the current flowing in that portion of the electrical circuit in accordance with Ohm's Law. These currents are determined by the impedance (resistance in the case of DC circuits) of the load, the resistance of the conductors, and the various string voltages, none of which can be considered to be constant. This effect may be termed common-impedance coupling and may have apparently random components at the terminals of each battery string Here, we describe an apparatus and method that accurately measures the midpoint voltage of each battery string and connects to a centralized measuring device. The percentage deviation of the midpoint voltage from equality to half the full string voltage is measured, and a limit set that. when exceeded, raises an alarm. The measurements may also be logged for diagnostic purposes, and to improve the life-cycle management of a group of storage-battery strings.

In an aspect a midpoint voltage sensor is connected to a first terminal at a first end of a battery string and to a second terminal at a second end of the battery string, with a third connection at a midpoint terminal of the battery string. In normal operation, the voltage that would exist between the third terminal and the second terminal should be half of the voltage between the first terminal and the second terminal. Degraded or faulty operation of one or more batteries in the battery string is manifest as a deviation of the midpoint voltage from the expected midpoint voltage. By measuring the voltages at the terminals of the batteries in the battery string, or very close thereto, the effects of common mode coupling are minimized. The individual sensor connections to the terminals do not carry substantial current and are sized such that the voltage drop is minimal as compared with the expected error voltage. The voltage between the first and the second terminal may be used to produce a voltage proportional to half of the input voltage as a reference value. The reference value voltage and the voltage between the second and third terminals are applied to the input of a logarithmic ratio amplifier, converting the magnitude of the voltages to a value related to the logarithm of error between the reference voltage and the measured mid-string voltage. The logarithm of the error signal may be thresholded and used to actuate an alarm if exceeds a predetermined value or the anti-log of the resultant error signal may be computed to linearize the error signal and be compatible with conventional signal processing techniques, the resultant of which may also be processed using a thresholding process. Typically, the error voltage signal is averaged for a period of time to minimize extraneous noise signals.

In yet another aspect, the voltage between the upper string terminal and the mid-point and the voltage between the mid-point and the lower string terminal may be measured, and processed as described above. The same criteria nay be applied for diagnostic purposes.

One or more battery strings of a battery supply system may have midpoint voltage sensors and the output of each of the midpoint voltage sensors associated therewith converted to linearized error signals as a part of a battery system health monitor. The individual signals are selected using an analog multiplexer, converted to digital values by an A/D converter and signal processing and evaluation performed by a computing device having a central processor and sufficient memory to store instructions for the operation thereof, for results and for any desired external communications for receiving parameters or reporting results.

DETAILED DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Embodiments of this invention may be implemented in hardware, firmware, software, or any combination thereof. In an aspect, where a computer or a digital circuit is used, signals may be converted from analog format to a digital representation thereof in an analog-to-digital (A/D) converter, as is known in the art. The choice of location of the A/D conversion will depend on the specific system design.

The instructions for implementing processes measurement, data analysis and communications processes may be provided on computer-readable storage media. Computer-readable storage media include various types of volatile and nonvolatile storage media. Such storage media may be memories such as a cache, buffer, RAM, flash, removable media, hard drive or other computer readable storage media. The functions, acts or tasks illustrated in the figures or described herein may be performed in response to one or more sets of instructions stored in or on computer readable storage media. The functions, acts or tasks are independent of the particular type of instruction set, storage media, processor or processing strategy and may be performed by software, hardware, integrated circuits, firmware, micro code and the like, operating alone or in combination. The instructions may be stored on a removable media device for reading by local or remote systems. In other embodiments, the instructions may be stored in a remote location for transfer through a computer network, a local or wide area network or over telephone lines. In yet other embodiments, the instructions are stored within a given computer or system.

Where the term "web" or "Internet" is used, the intent is to describe an internetworking environment, including at least one of a local area network (LAN) or a wide area network (WAN), where defined transmission protocols are used to facilitate communications between diverse, possibly geographically dispersed, entities. An example of such an environment is the world-wide-web (WWW) and the use of the TCP/IP data packet protocol, and the use of Ethernet or other hardware and software protocols for some of the data paths.

Figure 1:
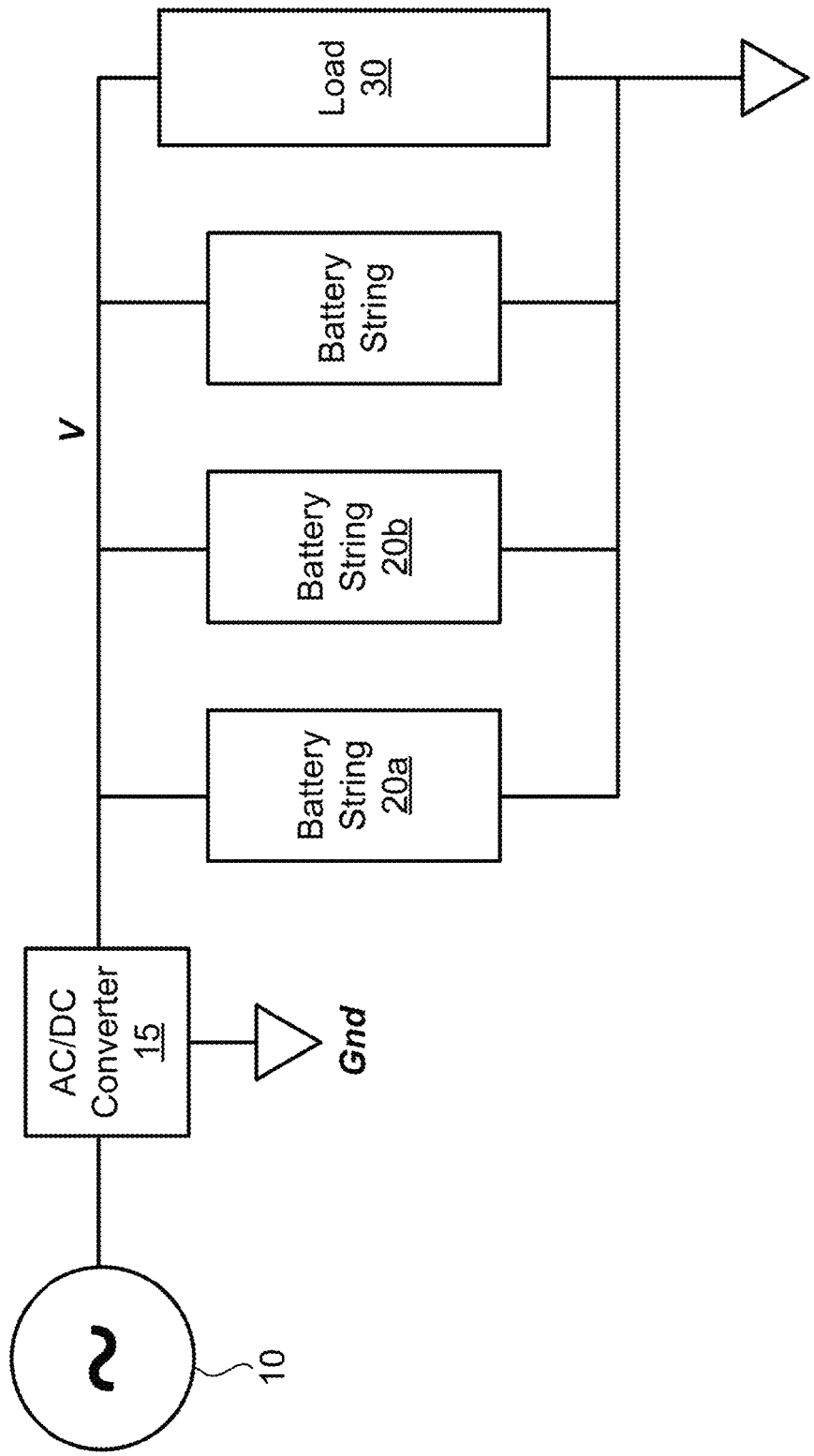
FIG. 1 is a block diagram of an example storage-battery backup system which may use a midpoint battery voltage sensor.

A battery power supply system may consist of two or more lead-acid storage batteries, the storage batteries configured in a series string, and one or more battery strings connected to electrical loads, and to a charging or recharging device to replenish the charge of the batteries when the batteries have been used as a temporary source of power, or to maintain the state of charge in anticipation of a power loss. An example of such a configuration is shown in FIG. 1, where several strings are shown arranged in parallel. The AC/DC converter 15 is connected to a primary source of electrical power 10, which may be the conventional AC power grid, or a local generator. The input source of power may be switchable between two or more sources (not shown) so that a failure of one source may not interrupt the power supply for an extended period of time. During the time need to switch between alternative power supplies, and which may include the starting time for a motor-generator backup power supply, such as a diesel-electric generator, the battery strings 20a, 20b provide DC current to the load 30. The load represents any of the equipment using the DC power, and may include computing equipment, telephone switching equipment or the like. When there is not a source of back-up primary power, the battery strings may have a larger capacity so as to permit a longer period of primary power outage. Such systems are often termed Uninterruptable Power Supplies (UPS).

The voltage V applied to the load 30 depends on the requirements of the specific equipment being powered, and typically ranges from 24 VDC to 480 VDC, although both higher and lower voltages are used. In a telecommunications application, for example, 48 VDC may be used. A plurality of rechargeable storage batteries is connected in series to result in the design voltage. As storage batteries, such as lead-acid technology batteries, have a nominal terminal voltage of 12.9 VDC (open circuit), a plurality of batteries is connected in series to obtain the design voltage. (In the present description, a terminal voltage of 12 VDC is used as an approximation, for convenience.) The capacity of the storage batteries is expressed in ampere-hours and is a measure of the time-to-discharge of a battery supplying a known current. but storage batteries are not normally fully discharged in operation. The current requirements of the load and duration of operation may exceed that which may be supplied by a single string of storage batteries, and thus a plurality of storage battery strings comprised of a plurality of storage batteries connected in series, are connected in parallel.

The description herein may use lead-acid technology storage batteries as examples, however, nothing herein is intended to limit the use of the system and method to any particular battery chemistry type intended to serve the same or similar function. Batteries intended for such uses are often designed so that a plurality of individual battery cells are connected in series to achieve the desired terminal voltage. A defect in such a battery unit may result, for example in an internal short circuit of an individual battery or, alternatively an increase in internal resistance, where such defects are expected to alter the voltage across the battery terminals, with resultant deviation of the midpoint voltage of the string from the expected value.

Batteries in the battery strings are expected to have substantially the same capacity, internal resistance, operating temperature, and other characteristics, such as terminal voltage and float current. A comparison of the performance (sometimes called "health") of the individual battery strings with respect to each other or quantitatively, alone, may provide an indication of the quality state or "health" of the batteries, and permit servicing of the battery system prior to an actual failure. Limit values may also be set to initiate alarms.

Herein we describe one of the possible techniques for monitoring the health of batteries installed as strings in a battery backup system. Other techniques may monitor current to the strings, or to each string, the voltage at each string, the voltage of each battery, or the like. They may serve similar and sometimes overlapping functions and address differing aspects of the diagnosis of the battery system for the purposes of responding to battery faults (such as internal faults), storage capacity degradation as a result of aging or other characteristics that may have implications for safety or preventive maintenance. Not all of these techniques may be used in every installation.

When a battery of a battery string become defective, through a fault such as a shorted cell internal to the battery, the voltage between the terminals of the battery may decrease, thus decreasing the voltage across a string of a plurality of batteries in series. This may cause an anomalous current flow through the battery from a power bus having more than one or more connected parallel battery string. So, the actual effect of such faults on the midpoint voltage is complex and dependent on the overall system architecture. Increased current or internal resistance may cause high localized heating further exacerbating the problem and cause failure of the string and possible failure of the backup-battery system to perform its function. Measuring the voltage across each of the batteries in a string is one way that would uncover this problem, but the number of sensing circuits and their integration into a health monitoring system would be expensive. Further, it is often the failure of sensors or their connections rather than the sensed equipment which results in an alarm.

Desirably the information should be obtained with the least complicated sensing circuit. Measurement of the mid-string voltage has been considered effective as a diagnostic tool. However, the sensitivity of the technique to common-impedance coupling and difficulties in simply integrating the sensor into a more complex monitoring system may preclude its use. Costs of cabling, and diversity of signaling techniques are also practical design problems.

Midstring voltage monitoring compares the voltage at a location midway between the two terminals of the string that are connected to the system bus with the expected value of the voltage based on the voltage across the entire string. As the tolerance of mid-string voltage deviation may be of the order of 2 percent, the apparatus for determining the percentage deviation needs to avoid the deleterious effects of common-impedance coupling or ground loops to achieve the desired accuracy and precision. When the spurious effects of this coupling are obviated, the measurement is more stable and accurate.

The string voltage of each string in a multi-string system will be different due to the difference in string wiring cable lengths and the amount of string current (charge/discharge) being supplied or drawn from the batteries and the resulting time varying voltage drops in various portions of a multiple string battery power supply. Using a single battery bus voltage, for example at the AC/DC converter 15 or the load 30 as representative of the string battery terminal voltage the of all of the strings is therefore inaccurate and the apparatus needs to connect to an end and mid-point of each battery string being monitored and to use that voltage for analysis of the health of the individual battery string.

Figure 2:
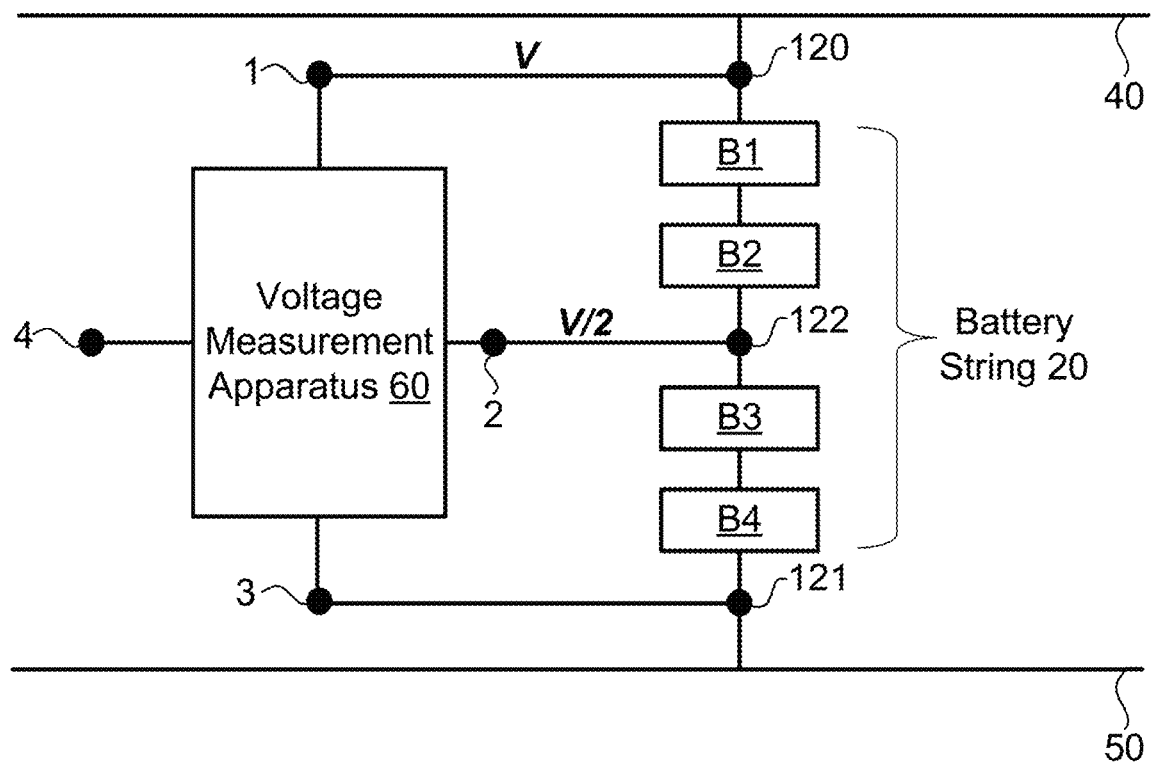
FIG. 2 is a detailed block diagram of a battery string in the backup battery system of FIG. 1 illustrating the attachment locations of the sensor to a battery string

FIG. 2 shows the arrangement where each battery string, which may be a part of a plurality of battery strings connected in parallel to supply an electrical load, has a voltage measurement apparatus 60 connected, preferably directly to the end terminals 120, 121 of a battery string and to a midpoint terminal 122. Here we show a string of four (4) 12-volt storage batteries B1, B2, B3, and B4 connected in series to yield a nominal terminal voltage of 48 volts, with a connection made to a mid-point 122 of the string. The string upper battery terminal 120 is connected to a first system bus 40 and the string lower battery terminal 121 is connected to a second system bus 50 and a plurality of battery strings 20 may be connected to the buses to supply the required current to the load 30. Since midpoint has two batteries connected together, usually with a very-low resistance strap, link, or cable, either the lower terminal of the upper pair of batteries or the upper terminal of the lower pair of batteries may be used as an attachment point. But, for consistency, one of the options should be chosen for a particular installation.

The voltage at 120 is connected to a first input 1 of the voltage measurement apparatus 60, the voltage at terminal 122 is connected to the second input 2 and the voltage at 121 is connected to the third input 3. The resultant error voltage is output at terminal 4 of the voltage measurement apparatus 60.

The voltage between connection points 120 and 121 is the terminal voltage of the string, V, whereas the voltage between the midpoint 122 and either terminal 120 or 121 would be V/2, in an ideal situation.

Figure 3:
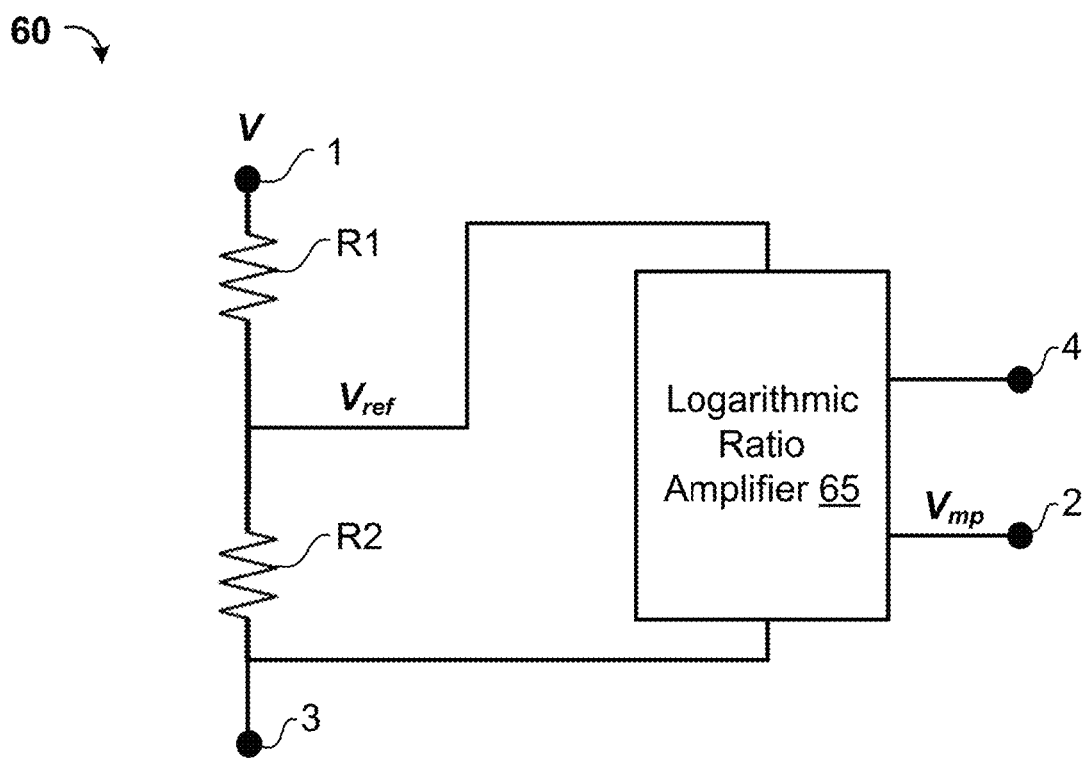
FIG. 3 is a simplified circuit diagram of string midpoint voltage sensor where the midpoint voltage reference is derived from a resistive divider network connected across the battery string.

FIG. 3 is a circuit that can perform the function of a midpoint voltage sensor where a comparison voltage, Vref, is created to represent this ideal situation by a resistive divider circuit R1, R2, where the values of R1 and R2 are equal to achieve a result that is half of the voltage between 120 and 121. As slight inequality in the resistor values will result in a fixed error voltage, attention should be paid to the quality of the resistors and the temperature coefficient of change, since differences arising from such changes will appear to come from the battery string itself. The resistors should have a sufficiently high value such that self-heating is minimized, although some self-heating may keep the resistor temperature above ambient and minimize the effect of ambient temperature variations. As the comparison will be made between analog voltages, this method of determining the expected value of the mid-point voltage is both simple and accurate.

Vmp (midpoint) ref is the actual voltage between 120 and 122, whereas Vref is half of the voltage between 120 and 121, and should be closely equal to 24V in this example. Vref and Vmp are input to the terminals 2 of a differential amplifier or a logarithmic ratio amplifier 65 and the output at terminal 14 is the deviation from the balance, or the logarithm of the ratio of Vmp to Vref.

Figure 4:
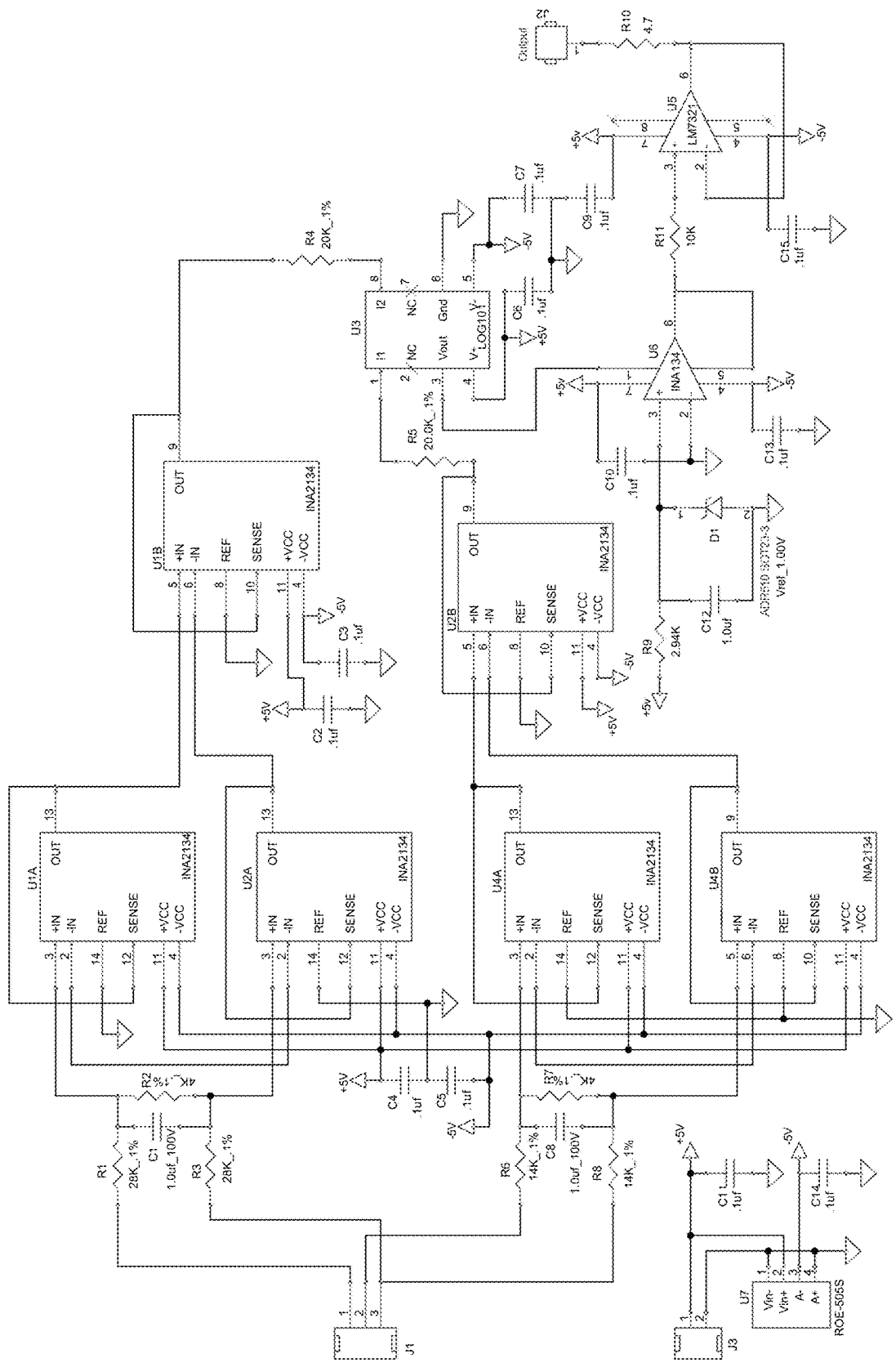
FIG. 4 is a detailed circuit diagram of a string midpoint voltage sensor illustrating the isolation electronic ground form the battery string and the offset voltage used in single-ended multplexer interfacing.

The resultant output of the comparison, being a voltage relatively small compared with the string voltage, may be normalized after A/D conversion using the average string voltage as the denominator, or ratio of the two voltages measured by using a logarithmic amplifier as shown in the schematic of a prototype of the sensor apparatus which has been constructed and evaluated by the inventors (FIG. 4).

In the circuit of FIG. 3, the values of Vref and Vmp may be input to a logarithmic ratio amplifier circuit (TI, LOG101, available from the usual distributors), the output of which is the error value log (Verr)=log (Vmp)-log (Vref). The antilog of the log (Verr) value is the fractional error in the balance between the upper and lower portions of the battery string. The antilog may be computed by any of the known algorithms on the digitized value of the output of an A/D converter. Alternatively, the threshold value may be set in terms of log (Verr). However, if more detailed analysis is done for diagnostic purposes, the measurement is more technically correct if converted to percentage variation prior to further signal processing.

The deviation of the midstring voltage from the reference voltage Vref (alternatively from a measurement of the string voltage V divided by 2) can be either positive or negative depending on the actual condition of the batteries in the battery string. If an analog-to-digital converter (ADC) 80 or multiplexer 70 of the health monitoring equipment (shown in FIG. 5) is single-ended, an offset, for example 1 volt, may be added to the output of the logarithmic ratio amplifier circuit prior to the output of the midpoint voltage sensor to keep the value of the signal at a positive value.

If an offset voltage has been added by midpoint voltage sensor the A/D converted signal may have the offset signal subtracted from the samples prior to further processing, so that the antilog of the resultant value is the percentage error in the mid-point voltage with respect to the reference voltage.

The controller 90 may be programmed with an algorithm that determines the antilog of the log difference value and makes it available for alarm analysis and reporting.

Performing the initial signal processing in close proximity to the battery string, and the use of a logarithmic ratio circuit to do so, obtains the fractional error value directly without having to digitize the two voltages, as well as reducing the maximum voltages to be processed in the event of a cell or battery fault. The error signal ground may be established by the remainder of the cabling, so each of the string error values measured can be connected by a single wire. Depending on the installation, the apparatus can also include amplification of the error signal and line drivers or buffers (not shown).

An example of a circuit the inventors have used to evaluate a non-limiting embodiment of the invention is shown in FIG. 4. The voltages to be measured are input to the apparatus at connector JI, where pin 2 is the full string voltage, such as 48 VDC, pin 1 is the mid-string voltage and pin 3 is the location where these voltages are referenced. In the present example the mid-string voltage Vmp is about 24 VDC and pin 3 is the battery string power ground.

Integrated circuit pairs U1A and U1B isolate, or decouple the voltage between pin 3 and pin 1 from the battery string from the electronic ground and may have a resistor divider network at the input so that the gain of the circuit is twice the gain of the isolation circuit comprised of U4A and U4B, so that the outputs at pins 13 of should be equal when the midstring voltage is half of the total string voltage. The isolated voltages are each then referenced to the circuit ground of the electronic circuit using U1B and U2B.

The isolation function may be implemented by differential line receivers type IN2134 from Burr-Brown, available from the usual suppliers. The signals are now sufficiently isolated for any stray ground loops which may exist due to the battery string wiring or other stray paths. The two signals representing the actual voltage at the midpoint and a comparison signal of half the actual voltage of the full string are input to a logarithmic ratio amplifier such as a LOG101 such that the output signal represents the logarithm of the fractional error between the two input signals. The two input voltages are expected to be nearly equal when in normal operation and differ by perhaps 2 to 3 percent under fault conditions. In the particular example, the output would be connected via a wire to the input multiplexer of an A/D converter of the health monitoring system. Often these multiplexers are single ended. As the output signal of the logarithmic ratio amplifier may be either positive or negative depending on the specific state of the battery string fault, a stable fixed offset voltage may be added to the analog result, which may be 1 VDC so as to be compatible with such multiplexers. If a differential input multiplexer is used this offset circuit need not be used.

Figure 5:
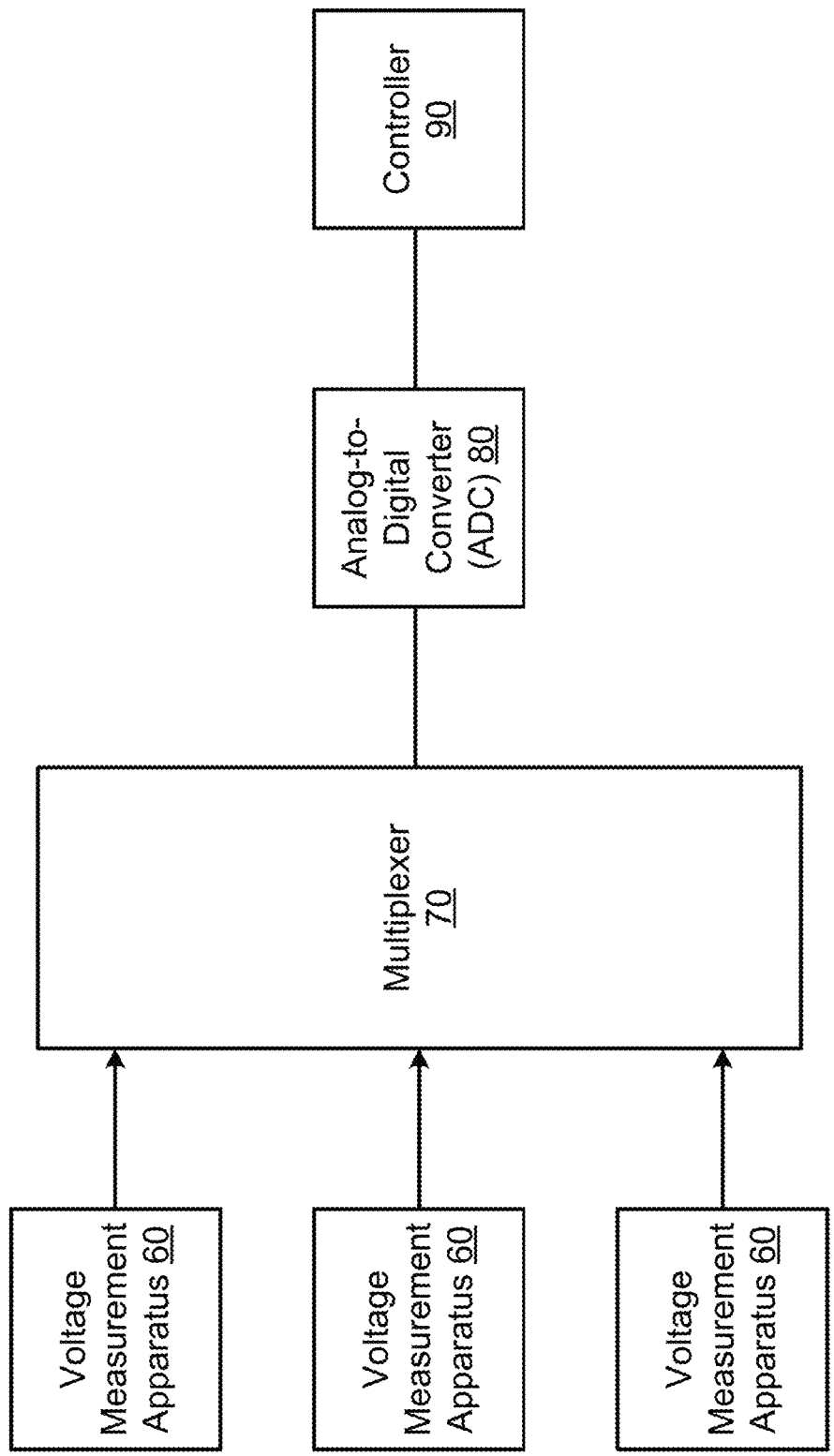
FIG. 5 is a block diagram of a battery system health monitoring system where a plurality of midpoint voltage sensors, located in proximity to individual battery strings are connected to a multiplexed interface to an analog-to-digital converter and a processor.

FIG. 5 illustrates a system for the measurement of the mid-string voltages for a plurality of battery strings 20 (shown in FIG. 1), with the output of each voltage measurement apparatus 60 routed over a single wire, which may be part of cabling of other control and health monitoring circuits, including, for example temperature sensors. The inputs to a multiplexer 70 may be digitized by the ADC 80 and the resultant data streams individually analyzed by the controller 90 for performing this aspect of health monitoring.

In another aspect, the voltage at other battery terminals can be monitored such that the particular battery where a problem exists may be detected. Either the string voltage may be used as the reference, or a plurality of resistive dividers or fixed gain amplifiers may be employed to derive a plurality of reference voltages.

An advantage of the use of a logarithmic ratio amplifier in this apparatus is that the magnitude of the voltage representing the error between the two voltages is small compared with the voltage between the terminals of the battery string. The stress on the circuits is less and any accidental fault current is minimized.

One communications protocol that may be used to manage the battery string system over a communications network is Simple Network Management Protocol (SNMP). The software running on the system controller and the remote monitor may act as either an agent or a manager so as to exchange information using the Internet protocol, which is presently known as TCP/IP. The functioning of the Internet is described by a series of public documents known as Request for Comment (RFC) as is well known, and will not be further described herein. These aspects will be understood by persons of ordinary skill in the art.

A method of measuring the midpoint voltage of a multi-battery storage battery string includes:
 connecting a first sensing wire to an uppermost battery terminal of the battery string;
 connecting a second sensing wire to a lowermost battery terminal of the battery string;
 connecting a third sensing wire to a battery terminal at a symmetrical location with respect to the uppermost battery and the lowermost battery;
 connecting the first, the second, and the third wires to respective input terminals of a midpoint voltage sensor circuit;
 isolating the three sensor wires from the electrical circuit ground; and
 determining the error voltage ratio between a first voltage between the first sensing wire and the sensing wire and a second voltage between third sensing wire and the second sensing wire.

In an aspect, the error voltage ratio may be determined using a analog logarithmic ratio amplifier.

In another aspect, as the second voltage is expected to be equal to half of the first voltage under normal operating conditions, the first voltage may be divided by two prior to the determination of the error ratio.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

In another aspect, a software product is stored in a computer-readable medium, and the instructions of the product configure a computer to perform the steps in the method.

It is therefore intended that the foregoing detailed description be regarded as illustrative rather than limiting, and that it be understood that it is the following claims, including all equivalents, that are intended to define the spirit and scope of this invention.

What is claimed is:

1. A system for monitoring of a battery system, comprising:
 a plurality of storage-battery strings each such strings comprising at least two storage batteries connected in series to form a storage-battery string, one or more of the storage-battery strings configured to be connectable to an electrical load and to a battery charging device;
 a battery string health monitoring system comprising at least one midpoint voltage sensor and a health monitoring system,
 the midpoint voltage sensor further comprising:
  a first input terminal configured to be attachable to a battery terminal of a first end of the storage-battery string;
  a second input terminal configured to be attachable to a battery terminal of a second end of the storage-battery string;
  a third input terminal configured to be attachable to a battery terminal located at a midpoint of the storage-battery string;
  a first output terminal configured to be connectable to an input of the health monitoring system, a first electronic circuit configured to produce a voltage reference signal proportional to half of a voltage between the first input terminal and the second input terminal;

a second electronic circuit configured to produce difference proportional to a voltage difference between the second input terminal and the third input terminal;

an analog logarithmic ratio circuit having an output of the first electronic circuit as a first input voltage, an output of the second electronic circuit as a second input voltage, and a voltage at a second output terminal equal to a difference between a logarithm of the first input voltage and a logarithm of the second input voltage, the second output terminal communicating with the first output terminal; and the health monitoring system further comprising, an analog signal input multiplexer, an analog-to-digital (ADC) converter, a processor including a central processing unit, electronic memory, at least some of which is non-volatile, and a communications interface;

wherein the first output terminal is connectable to the health monitoring system by a conductor from the first output terminal to an input terminal of the analog signal input multiplexer and is processed by the health monitoring system to produce a numerical value that is proportional to a magnitude and sign of the voltage at the first output terminal, and wherein the numerical value is processed by performing an antilog operation so as to convert the numerical value to be proportional to a ratio of the voltage at the third input terminal to the voltage between the first input terminal and the second input terminal.

2. The system of claim 1, wherein the numerical value is compared with a first preset threshold value and an alarm is initiated when the first preset threshold value is exceeded.

3. The system of claim 1, wherein a converted numerical value is compared with a preset threshold and an alarm is initiated when the preset threshold is exceeded.

4. A midpoint voltage sensor comprising:
a first input terminal configured to be attachable to a battery terminal of a first end of a storage-battery string;
a second input terminal configured to be attachable to a battery terminal of a second end of the storage battery string;
a third input terminal configured to be attachable to a battery terminal located at a midpoint of the storage battery string;
a first output terminal configured to be connectable to an input of a health monitoring system,
a first electronic circuit configured to produce a voltage reference signal proportional to half of a voltage between the first input terminal and the second input terminal;
a second electronic circuit configured to produce a voltage proportional to the voltage between the second input terminal and the third input terminal; and
an analog logarithmic ratio circuit having an output of the first electronic circuit as a first input voltage, an output of the second electronic circuit as a second input voltage, and a voltage at a second output terminal equal to a difference between a logarithm of the first input voltage and a logarithm of the second input voltage, the second output terminal communicating with the first output terminal, wherein the first input terminal and second input terminal are connected to a first amplifier and the second input terminal and third input terminal are connected to a second amplifier, wherein a gain of the first amplifier is one half a gain of the second amplifier, and outputs of the first amplifier and the second amplifier are connected to the analog logarithmic ratio circuit.

5. The midpoint voltage sensor of claim 4, wherein the voltage reference signal is produced by a resistive divider network, having a first resistor connected to the first input terminal, a second resistor connected to the second input terminal, remaining terminals of the first resistor and the second resistor connected together and being a source of the reference voltage signal.

6. The midpoint voltage sensor of claim 5, wherein the first resistor and the second resistor have a same resistance value.

7. A method of monitoring a midpoint voltage of a storage-battery string of a plurality of storage-battery strings, the method comprising:
providing a midpoint voltage sensor for each monitored storage-battery string, the midpoint voltage sensor comprising:
a first input terminal configured to be attachable to a battery terminal at a first end of the storage-battery string;
a second input terminal configured to be attachable to a battery terminal at a second end of the storage-battery string;
a third input terminal configured to be attachable to a battery terminal located at a midpoint of the storage-battery string;
a first output terminal configured to be connectable to an input of a health monitoring system,
a first electronic circuit having an input circuit configured to produce a voltage reference signal proportional to half of a voltage between the first input terminal and the second input terminal;
a second electronic circuit having an input circuit configured to produce a voltage proportional to the voltage between the second input terminal and the third input terminal;
an analog logarithmic-ratio circuit having an output of the first electronic circuit as a first input voltage, an output of the second electronic circuit as a second input voltage, and a voltage at a second output terminal equal to a difference between a logarithm of the first input voltage and a logarithm of the second input voltage, the second output terminal communicating with the first output terminal
wherein the first input terminal and second input terminal are connected to a first amplifier and the second input terminal and third input terminal are connected to a second amplifier, wherein a gain of the first amplifier is one half a gain of the second amplifier, and outputs of the first amplifier and the second amplifier are connected to the analog logarithmic ratio circuit;
attaching the first input terminal to the first end of the storage-battery string, the second input terminal to the second end of the storage battery string and the third input terminal to the midpoint of the storage-battery string; and
acquiring and analyzing an error signal at the first output terminal.

8. The method of claim 7, where the step of acquiring the error signal consists of connecting the first output terminal of the midpoint voltage sensor to an analog-to-digital converter (ADC), converting the error signal to a digital value and inputting the digital value to a processor.

9. The method of claim 8, wherein the processor is configured to store each digital value and to compute one of a) an antilog of the digital value, or b) a numerical value of the error signal.

10. The method of claim 9, wherein an absolute value of a) or b) is compared with a predetermined threshold value, and an alarm is initiated by the processor if the predetermined threshold value is exceeded.

11. The method of claim 10, wherein the predetermined threshold value is 2 percent of a storage-battery terminal voltage.

12. The method of claim 10, wherein the absolute value is averaged for a predetermined number of samples.

13. The method of claim 12, wherein the predetermined number of samples averaged is an equivalent of 2 seconds of data.

14. A midpoint voltage sensor, comprising:
a first input terminal, connectable to a first end of a string of two or more batteries;
a second input terminal, connectable to a second end of the string of two or more batteries;
a third input terminal, connectable to a midpoint of the string of two or more batteries;
an output terminal;
a reference voltage circuit;
a first differential amplifier;
a second differential amplifier, wherein a gain of the first differential amplifier is one half of the gain of the second differential amplifier; and
a logarithmic ratio circuit,
wherein the reference voltage circuit outputs a reference voltage derived from a difference between a voltage at the first input terminal and a voltage at the second input terminal;
wherein the reference voltage and the voltage between the third input terminal and either the first input terminal or the second input terminal are input to the logarithmic ratio circuit, and an output of the logarithmic ratio circuit is connected to the output terminal.

15. The midpoint voltage sensor of claim 14, wherein the reference voltage circuit is a resistive divider network producing a reference voltage equal to one-half of a voltage difference between the first input terminal and the second input terminal.

16. The midpoint voltage sensor of claim 14, wherein the first input terminal and the second input terminal are input to the first differential amplifier, the third input terminal and the second input terminal are input to the second differential amplifier and the output of the first and the second differential amplifiers are input to the logarithmic ratio circuit.

* * * * *